(12) United States Patent
Shibata et al.

(10) Patent No.: US 10,171,102 B1
(45) Date of Patent: Jan. 1, 2019

(54) OVERSAMPLED CONTINUOUS-TIME PIPELINE ADC WITH VOLTAGE-MODE SUMMATION

(71) Applicant: Analog Devices Global Unlimited Company, Hamilton (BM)

(72) Inventors: Hajime Shibata, Toronto (CA); Yunzhi Dong, Weehawken, NJ (US); Zhao Li, North York (CA); Trevor Clifford Caldwell, Toronto (CA); Wenhua William Yang, Lexington, MA (US)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/865,742

(22) Filed: Jan. 9, 2018

(51) Int. Cl.
*H03M 1/12* (2006.01)
*H03M 3/00* (2006.01)
*H03M 1/66* (2006.01)
*H03M 1/06* (2006.01)

(52) U.S. Cl.
CPC ............. *H03M 3/30* (2013.01); *H03M 1/066* (2013.01); *H03M 1/126* (2013.01); *H03M 1/66* (2013.01)

(58) Field of Classification Search
CPC .......... H03M 3/30; H03M 1/66; H03M 1/126; H03M 1/066
USPC .................................................. 341/155, 161
See application file for complete search history.

(56) References Cited

U.S. PATENT DOCUMENTS

| | | | |
|---|---|---|---|
| 701,552 A | 6/1924 | Zobel | |
| 792,523 A | 3/1927 | Zobel | |
| 4,344,093 A | 8/1982 | Huber | |
| 5,861,828 A | 1/1999 | Opris | |
| 6,064,507 A | 5/2000 | Heflinger et al. | |
| 6,222,477 B1 | 4/2001 | Irie et al. | |
| 6,489,913 B1 | 12/2002 | Hansen et al. | |
| 6,809,672 B2 | 10/2004 | Gupta | |
| 6,956,517 B1 | 10/2005 | Baker | |
| 6,987,477 B1 * | 1/2006 | Aude .................. | H03M 1/0695 341/155 |

(Continued)

FOREIGN PATENT DOCUMENTS

| | | |
|---|---|---|
| CN | 102404014 | 4/2012 |
| CN | 102891682 | 1/2013 |

(Continued)

OTHER PUBLICATIONS

Jeffrey Harrison et al., *An LC Bandpass ΔΣ ADC with 70dB SNDR Over 20MHz Bandwidth Using CMOS DAC's*, ISCC 2012, Session 8, Delta-Sigma Converters, 8.1, 2012 IEEE International Solid-State Circuits Conference, 978-1-4673-0377-4/12 © 2012 IEEE, 3 pages.

Sebastian Loeda et al., *A 10/20/30/40 MHz Feed-Forward FIR DAC Continuous-Time ΔΣ ADC with Robust Blocker Performance for Radio Receivers*, 2015 Symposium on VLSI Circuits Digest of Technical Papers, 978-4-86348-502-0, 2 pages.

(Continued)

*Primary Examiner* — Brian Young

(74) *Attorney, Agent, or Firm* — Patent Capital Group

(57) ABSTRACT

A linear continuous-time (CT) delaying summation block is one of the key building blocks for CT multi-stage analog-to-digital converters (ADCs) such as CT pipeline ADCs and CT multi-stage delta-sigma (MASH) ADCs. The CT summation block is typically used on a stage of a CT multi-stage ADC to subtract a digital-to-analog converter (DAC) output signal from an analog input signal of the stage. Rather than using a current-mode summation, the CT delaying summation block can be implemented with voltage-mode summation.

25 Claims, 11 Drawing Sheets

(56) References Cited

U.S. PATENT DOCUMENTS

| | | | |
|---|---|---|---|
| 7,280,064 B2 | 10/2007 | Lin | |
| 7,443,332 B2 | 10/2008 | Knudsen et al. | |
| 7,551,114 B2* | 6/2009 | Joy | H03M 1/002 341/122 |
| 7,561,084 B1 | 7/2009 | Wong | |
| 7,561,095 B2 | 7/2009 | Sasaki | |
| 7,573,417 B2* | 8/2009 | Bailey | H03M 1/167 341/155 |
| 8,102,206 B2 | 1/2012 | Shibata | |
| 8,284,085 B2 | 10/2012 | Haroun et al. | |
| 8,570,200 B2 | 10/2013 | Ashburn et al. | |
| 8,570,201 B2 | 10/2013 | Ashburn et al. | |
| 8,896,475 B2 | 11/2014 | Shibata | |
| 8,941,517 B2 | 1/2015 | Satarzadeh et al. | |
| 8,970,411 B2* | 3/2015 | Haroun | H03M 3/344 341/143 |
| 9,124,293 B2 | 9/2015 | Belot | |
| 9,312,840 B2 | 4/2016 | Dong et al. | |
| 9,432,045 B2 | 8/2016 | Shibata | |
| 9,537,497 B2 | 1/2017 | Ho | |
| 9,762,221 B2 | 9/2017 | Dong et al. | |
| 9,774,344 B2 | 9/2017 | Shibata | |
| 2002/0140516 A1 | 10/2002 | Dufour et al. | |
| 2005/0057384 A1 | 3/2005 | Chen et al. | |
| 2007/0013571 A1 | 1/2007 | Fujimoto | |
| 2008/0204148 A1 | 8/2008 | Kim et al. | |
| 2008/0238754 A1 | 10/2008 | Knudsen | |
| 2008/0272944 A1 | 11/2008 | Zhou | |
| 2009/0055678 A1 | 2/2009 | Kummaraguntla | |
| 2012/0063519 A1 | 3/2012 | Oliaei | |
| 2012/0086589 A1 | 4/2012 | Haroun et al. | |
| 2012/0086590 A1 | 4/2012 | Satarzadeh | |
| 2012/0326906 A1 | 12/2012 | Haroun et al. | |
| 2013/0021180 A1 | 1/2013 | Shabra et al. | |
| 2013/0127646 A1 | 5/2013 | Kumar et al. | |
| 2013/0214946 A1 | 8/2013 | Verbruggen | |
| 2014/0266821 A1 | 9/2014 | Shibata | |
| 2015/0042501 A1 | 2/2015 | Shibata | |
| 2015/0109158 A1 | 4/2015 | Dong | |
| 2015/0249445 A1 | 9/2015 | Dong et al. | |
| 2016/0269045 A1 | 9/2016 | Srinivasan et al. | |
| 2016/0359498 A1 | 12/2016 | Shibata | |
| 2016/0373101 A1 | 12/2016 | Dong et al. | |
| 2017/0187387 A1 | 6/2017 | Srinivasan et al. | |

FOREIGN PATENT DOCUMENTS

| | | |
|---|---|---|
| EP | 2779464 | 9/2014 |
| KR | 10-2012-0054087 | 5/2012 |
| KR | 10-1647252 | 8/2016 |
| WO | 2004/066494 | 8/2004 |
| WO | 2011/029103 | 3/2011 |

OTHER PUBLICATIONS

Imran Ahmed et al., *A Low-Power Gm-C-Based CT-ΔΣ Audio-Band ADC in 1.1V 65nm CMOS*, 2015 Symposium on VLSI Circuits Digest of Technical Papers, 978-4-86348-502-0, 2 pages.

Hajime Shibata et al., *A 9GS/s 1GHz-Bw Oversampled Continuous-Time Pipeline ADC Achieving—161dBFS/Hz NSD*, ISSCC 2017, Session 16, Gigahertz Data Converters, 16.2, 2017 IEEE International Solid-State Circuits Conference, 978-1-5090-3758-2/17 © 2017 IEEE, 3 pages.

Office Action (OA1) issued in CN Patent Application Serial No. 201410095239.1 dated Sep. 26, 2016, (with Summary of Relevance) 8 pages Office Action (OA1) issued in CN Patent Application Serial No. 201410095239.1 dated Apr. 25, 2017, (with Summary of Relevance) 4 pages.

European Search Report issued in EP Patent Application Serial No. 14157548.0 dated Jul. 8, 2015, 7 pages.

W. Kester, Data Conversion Handbook 3rd edition, Chapter 3, Section 3.2, Analog Devices, Inc. ISBN-10:0750678410, 2004, 142 pages.

David Gubbins, Bumha Lee, Pavan Kumar Hanumolu, and Un-Ku Moon, "Continuous-Time Input Pipeline ADCs", IEEE J. Solid State Circuits, vol. 45, No. 8, Aug. 2010, pp. 1456-1468.

Ahmed Gharbiya, and David A. Johns, "A 12-bit 3.125 MHz Bandwidth 0-3 MASH Delta-Sigma Modulator", IEEE J. Solid-State Circuits, vol. 44, No. 7, Jul. 2009, pp. 2010-2018.

Masoud Koochakzadeh et al., "Miniaturized Transmission Lines Based on Hybrid Lattice-Ladder Topology", IEEE Transactions on Microwave Theory and Techniques, vol. 58, No. 4, Apr. 2010, pp. 949-946, 8 pages.

W. Kester, "Oversampling interpolating DACs", MT-017, tutorial documents, Analog Devices, Inc. available at http://www.analog.com/static/imported-files/tutorials/MT-017.pdf, 2009.

B.Y. Karmath et al., "Relationship between frequency response and setting time of operational amplifiers", IEEE Journal of Solid-State Circuits, vol. SC-9, No. 6, Dec. 1974.

David Gubbins, Bumha Lee, Pavan Kumar Hanumolu, and Un-Ku Moon, "A Continuous-Time Input Pipeline ADC", Custom Integrated Circuit Conference, Sep. 2008.

David Gubbins, Bumha Lee, Pavan Kumar Hanumolu, and Un-Ku Moon, "A Continuous-Time Input Pipeline ADC with inherent anti-alias filter", Custom Integrated Circuit Conference, Sep. 2009.

Kwang-Jin Koh et al., *A Millimeter-Wave (40-45 GHz) 16-Element Phased-Array Transmitter in 0.18-μ Si Ge BiCMOS Technology*, IEEE Journal of Solid-State Circuits, vol. 44, No. 5, May 2009, 12 pages.

W.E. Thomson, *Delay Networks Having Maximally Flat Frequency Characteristics*, BNSDOCID: <XP55242803A, Paper No. 872, Radio Section, 621.392.5, (first received Mar. 14, 1949; revised Jul. 14, 1949), 4 pages.

\* cited by examiner

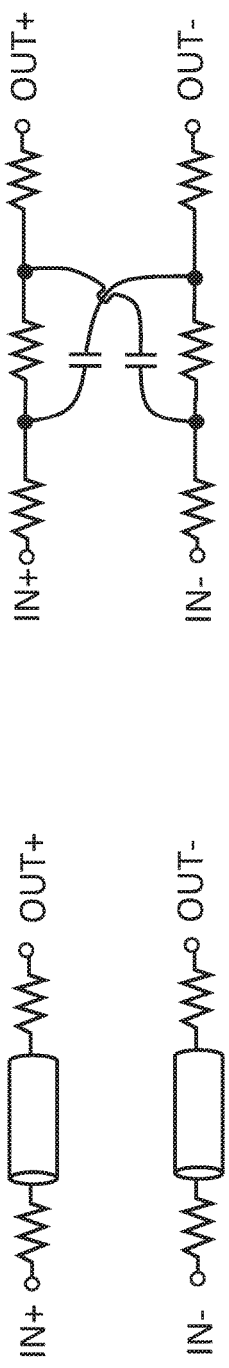
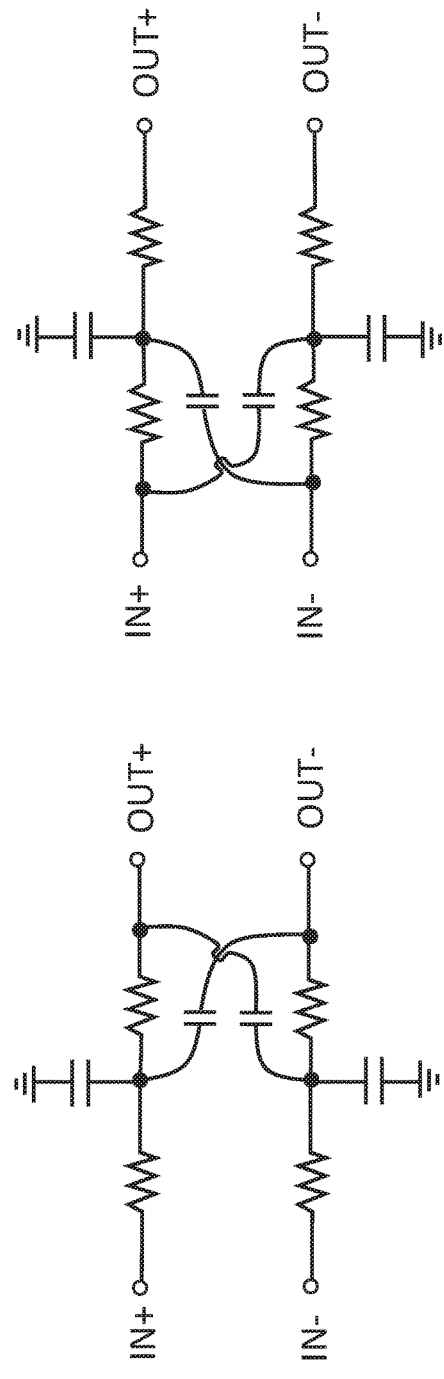
FIGURE 9
FIGURE 10
FIGURE 11
FIGURE 12

OVERSAMPLED CONTINUOUS-TIME PIPELINE ADC WITH VOLTAGE-MODE SUMMATION

TECHNICAL FIELD OF THE DISCLOSURE

The present disclosure relates generally to analog-to-digital converters (ADCs) and, more particularly, to oversampled continuous-time pipeline ADC with voltage-mode summation.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomena, e.g., light, sound, temperature or pressure for data processing purposes. ADCs are used in a broad range of applications including Communications, Energy, Healthcare, Instrumentation and Measurement, Motor and Power Control, Industrial Automation and Aerospace/Defense. Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 9 shows a differential delay element, according to some embodiments of the disclosure;

FIGS. 10-14 show different exemplary circuit implementations for the differential delay element of FIG. 9, according to some embodiments of the disclosure;

DESCRIPTION OF EXAMPLE EMBODIMENTS OF THE DISCLOSURE

Figure 1:
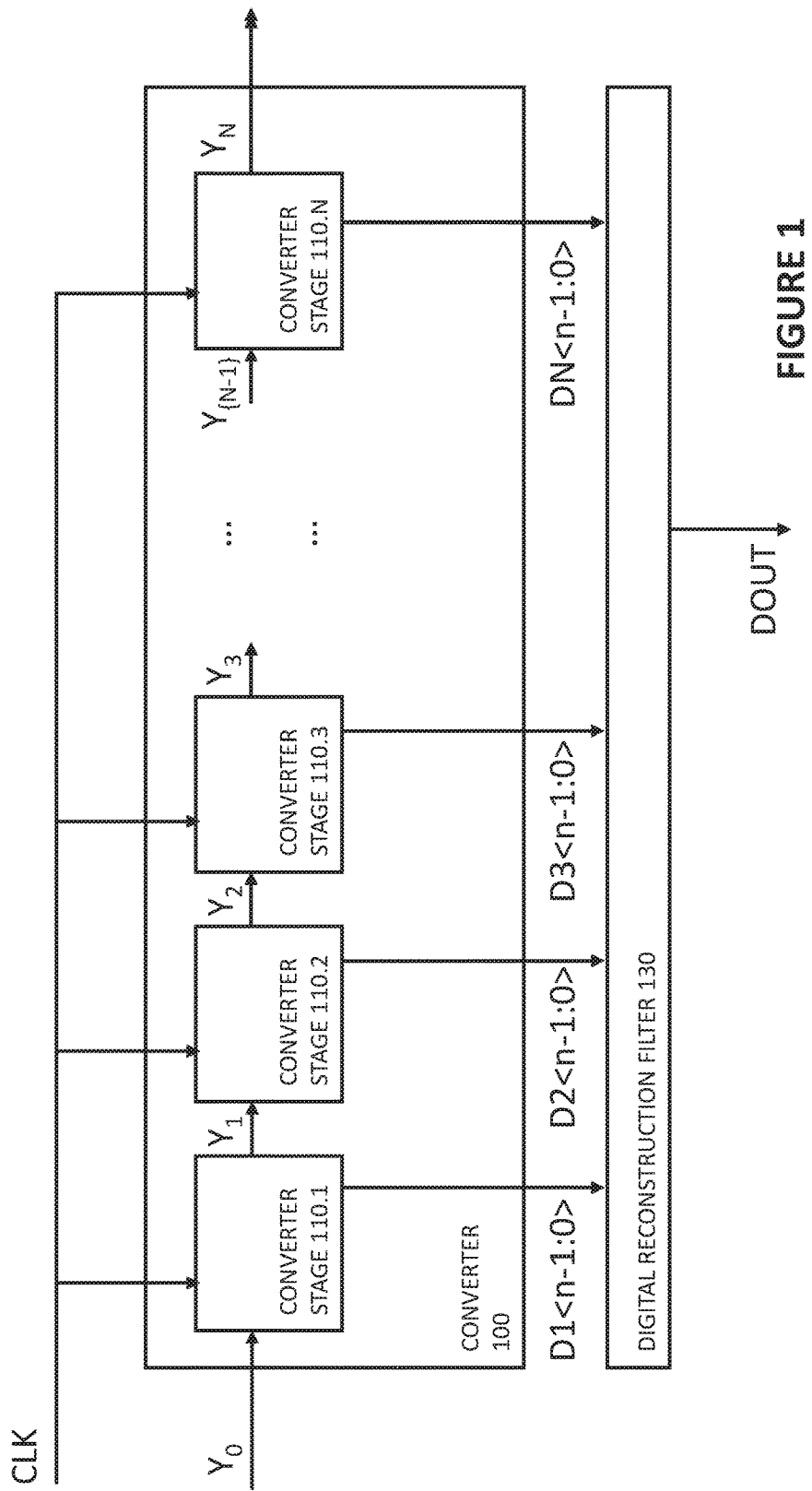
FIG. 1 is an illustrative system diagram of a multi-stage analog-to-digital converter, according to some embodiments of the disclosure.

A linear continuous-time (CT) delaying summation block is one of the key building blocks for CT multi-stage analog-to-digital converters (ADCs) such as CT pipeline ADCs and CT multi-stage delta-sigma (MASH) ADCs. The CT summation block is typically used on a stage of a CT multi-stage ADC to subtract a digital-to-analog converter (DAC) output signal from an analog input signal of the stage. Rather than using a current-mode summation, the CT delaying summation block can be implemented with voltage-mode summation.

Designing Analog-to-Digital Converters

ADCs are electronic devices that convert a continuous physical quantity carried by an analog signal to a digital number that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has converted a CT and continuous-amplitude analog input signal to a discrete-time and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

ADCs based on delta-sigma (DS) modulation (referred to herein as "DS ADCs") have been widely used in digital audio and high precision instrumentation systems. A DS ADC usually provides the advantage of being able to convert an analog input signal to a digital signal with high resolution at low cost. A DS ADC can include a loop filter, a quantizer, and feedback digital-to-analog converter (DAC). A DS ADC can vary depending on the order desired. The quantizer can be used to encode an input signal, employing, e.g., a low resolution ADC, as a 1-bit ADC, Flash ADC, Flash quantizer, etc. The loop filter, having one or more integrators, may be included to provide error feedback for the DS ADC and to help shape the noise from the quantizer out of baseband to higher frequencies. The error is usually generated by taking the difference between the original analog input signal and a reconstructed version of the original analog input signal generated using the feedback DAC (where digitized signal is converted back into an analog signal).

One key characteristic of a DS ADC is its ability to push the quantization noise (from the quantizer) to higher frequencies, also referred to as noise shaping. The amount of noise shaping depends on the order of the loop filter. As a result, DS ADCs are generally able to achieve high resolution analog-to-digital conversion. In some applications with an emphasis on noise shaping, a higher-order DS modulator may be used, i.e., more integrators and feedback paths are used in the loop filter for shaping even more of the quantization noise to high frequencies. DS ADCs use the shaping of quantization noise combined with oversampling to trade off resolution with signal bandwidth. High-order noise shaping and multi-bit implementations allow for more aggressive tradeoffs, but at the risk of making the ADC unstable. Multi-stage noise shaping (MASH) ADCs having multiple DS ADCs have been introduced, where MASH ADCs address the issue of instability by relying on the cascading of individually stable, low-order DS ADCs. MASH ADCs has a plurality of stages, i.e., cascaded low-order DS ADCs (the order of the cascaded stages can vary). Each cascaded low-order DS ADC digitizes a signal associated with a previous low-order DS ADC, such as a residue or quantization noise of the previous low-order DS ADC, formed through summation/subtraction of an analog input signal (or a filtered analog input signal) and a reconstructed input signal (e.g., from the feedback DAC).

MASH ADCs is one flavor of multi-stage ADCs, where multiple stages of DS modulation is cascaded. Another flavor of multi-stage ADCs is the pipeline ADC. Instead of having the DS modulator as the stage, a given stage in a pipeline ADC has a quantizer and a feedforward DAC. In a similar fashion as the MASH ADC, a stage in a pipeline ADC can digitize a residue from a previous stage. The residue is formed through summation/subtraction of a delayed input signal and a reconstructed input signal provided by the quantizer and feedforward DAC.

FIG. 1 is an illustrative system diagram of a multi-stage analog-to-digital converter, according to some embodiments of the disclosure. The multi-stage converter 100 includes a plurality of converter stages 110.1-110.N, connected in series, in pipeline, or in cascade configuration. Each converter stage (referred herein as a stage) may receive a clock signal ("CLK") and a respective analog input signal ("$Y_0$", "$Y_1$", "$Y_2$", "$Y_3$" ... "$Y_{N-1}$"), and may generate a respective analog output signal ("$Y_1$", "$Y_2$", "$Y_3$" ... "$Y_{N-1}$", "$Y_N$") and a respective digital output signal ("D1<n−1:0>", "D2<n−1:0>", "D3<n−1:0>" ... "DN<n−1:0>"). The respective analog output signals can be residues of the respective converter stages formed by summation/subtraction (e.g., $Y_1$ is a residue of converter stage 110.1).

"n" may represent the bit resolution of each converter stage. While it is illustrated in FIG. 1 that all converter stages have the same n number of bits for digital resolution, the converter stages need not have the same number of bits for digital resolution. Each converter stage may generate respective digital output signals, which may be combined to form an overall digital output for the multi-stage converter 100. The digital output signals can be provided to a digital reconstruction filter 130, which combines and/or filters the respective digital output signals and form the final converter digital output DOUT representing the analog input $Y_0$.

For simplicity, some signal paths may not be shown. For instance, in some cases, one or more converter stages may receive other analog input signals (e.g., analog input signals of the previous stages and/or analog input signals of subsequent stages).

The stages of the multi-stage ADC can be implemented with the same kind of converter architecture, or a combination of different converter architectures. Possible converter architectures include: DS modulation (e.g., as MASH ADCs), Flash conversion (e.g., as in pipelined ADCs), successive approximation register (SAR) conversion, and voltage-controlled-oscillator-based (VCO-based) conversion.

Converter 100 can be a CT converter, which does not use discrete-time (DT) circuitry for conversion, e.g., switched-capacitor circuits. CT ADCs can operate with lower power and achieve better wideband performance than its DT counterparts. However, CT converters can be more difficult to design.

Current-Mode Summation

Figure 2:
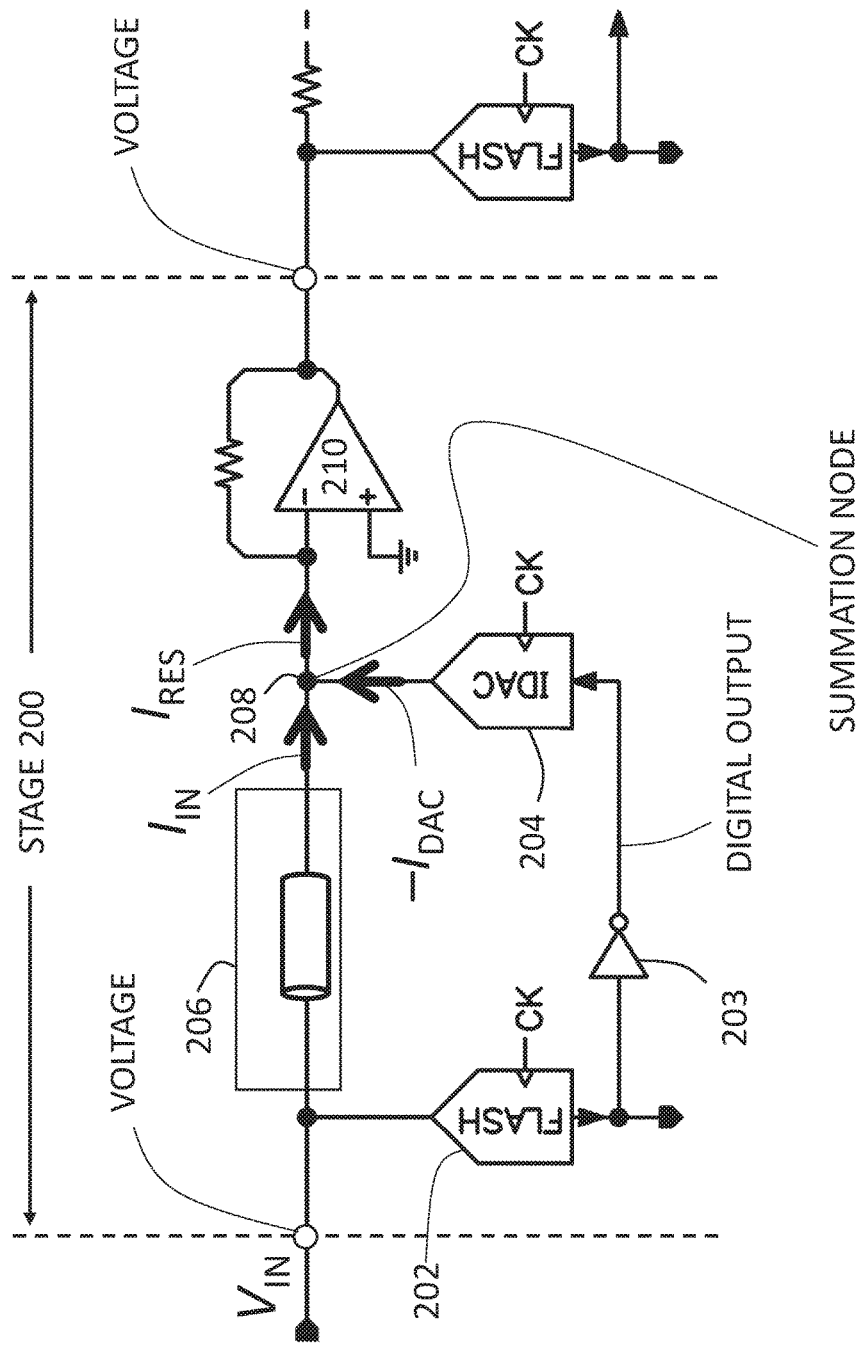
FIG. 2 illustrates current-mode summation in a stage of a continuous-time pipeline converter.

Forming a residue in a stage of a multi-stage ADC, i.e., summation/subtraction of two analog signals, can be done in the current domain. As an example, FIG. 2 illustrates current-mode summation in a stage 200 of a CT pipeline converter.

In the example shown, an analog input signal to the stage 200, i.e., an analog voltage input $V_{IN}$, is digitized by quantizer 202 (e.g., Flash ADC). The output from the quantizer 202 can be inverted by inverter 203. A current-output ("IDAC") DAC 204 takes the digital output and reconstructs the analog input signal in current form, i.e., $-I_{DAC}$. The current-output DAC can include current sources controlled by switches steering currents towards the output of the current-output DAC based on the input digital word to the current-output DAC.

The analog input signal, i.e., an analog voltage input $V_{IN}$, is delayed by a delaying element 206, which can include a delay line and one or more voltage-to-current ("V-to-I") resistors. The delaying element 206 can perform a voltage-to-current conversion and form a delayed current input signal $I_{IN}$. The current going through the delaying element 206 can be defined by a combination of resistances in the delaying element 206.

A current summation node 208 forms a current residue signal $I_{RES}$ by subtraction/summation, through Kirchhoff's Current Law, by summing $I_{IN}$ and $-I_{DAC}$, or equivalently, by subtracting $I_{IN}$ by $I_{DAC}$. Current-mode summation/subtraction is further characterized by having an operational amplifier (opamp) 210, within a transimpedance amplifier, hold the voltage at the current summation node 208 constant. Phrased differently, the input to the opamp 210 provides a virtual ground at the current summation node 208, so that the voltage at the current summation node 208 is fixed. Current going into the opamp 210, i.e., the current residue signal $I_{RES}$, is amplified by an impedance structure in the feedback path of the opamp 210. The opamp converts the amplified residue into a voltage.

The stage 200 can be repeated and cascaded to form the CT multi-stage converter.

Voltage-Mode Summation

Rather than performing summation/subtraction in the current domain, a stage in a CT multi-stage converter can perform summation/subtraction in the voltage domain when forming a residue for a subsequent stage. Voltage-mode summation can be particularly suitable for high-speed applications because the quality of the summation can rely on passive components. Voltage-mode summation is characterized by a voltage summation node which no longer has a fixed voltage, but has a voltage which would vary based on the analog input signal to the stage and a reconstructed analog input signal of the stage.

Figure 3:
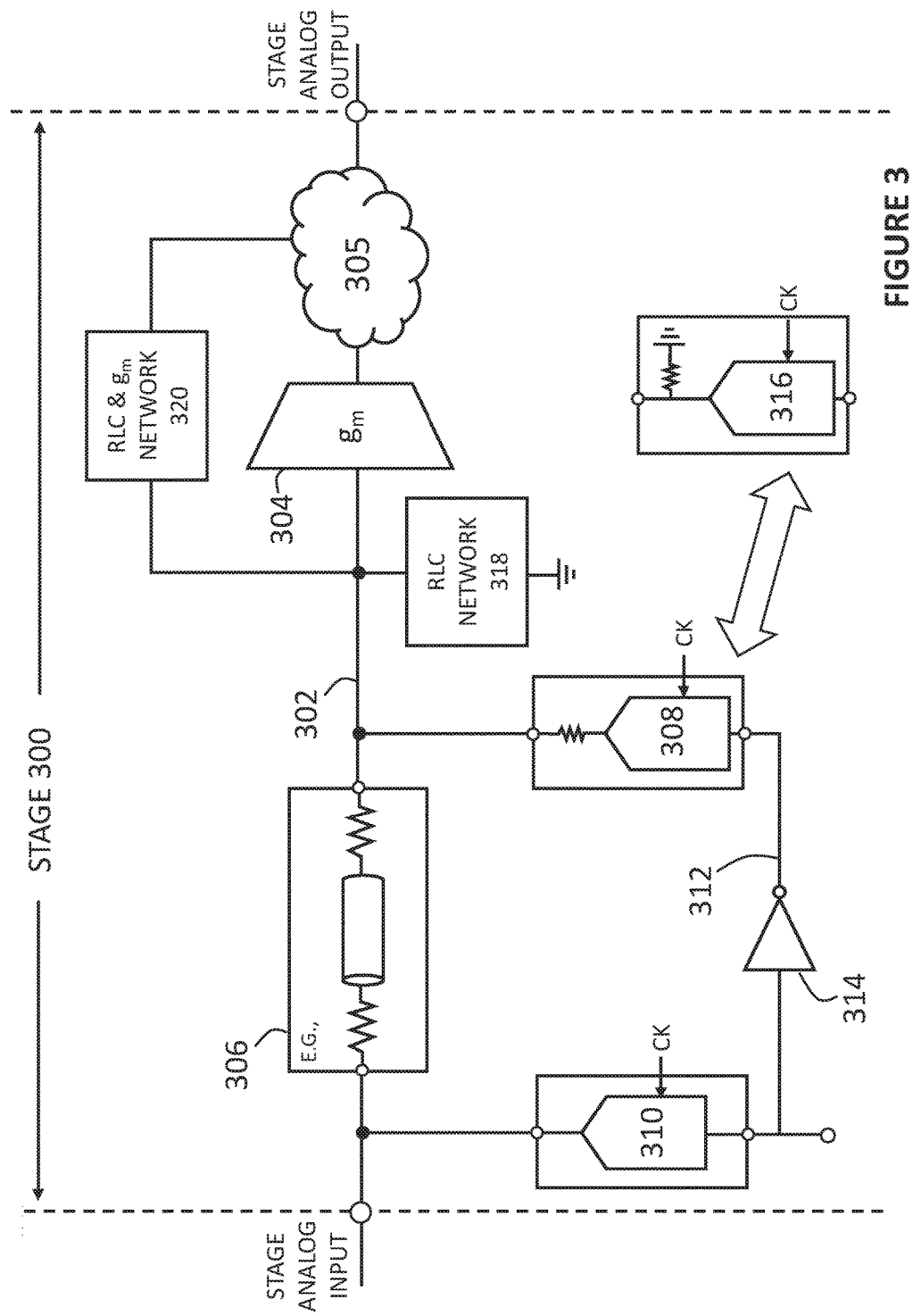
FIG. 3 illustrates voltage-mode summation for a stage in a continuous-time multi-stage analog-to-digital converter, according to some embodiments of the disclosure.

FIG. 3 illustrates voltage-mode summation for a stage 300 in a CT multi-stage ADC, according to some embodiments of the disclosure. The stage 300 includes a voltage summation node 302 to sum a delayed voltage input signal and a (negated and) reconstructed voltage input signal, and a transconductor 304 to sense a voltage signal at the voltage summation node 302 to generate an output signal of the stage 300. The transconductor 304 can perform voltage-to-current conversion, i.e., convert the voltage signal at the voltage summation node 302 to a current output signal. The stage 300 can, in some cases, include circuitry 305 to convert the current output signal into a voltage output signal of the stage 300 for further processing by a subsequent stage in the multi-stage ADC.

The stage 300 can include a delaying element 306 to generate the delayed voltage input signal (i.e., a delayed voltage input signal) from an input signal to the stage. The delaying element 306 can include a (CT) delay line and one or more resistors. The stage 300 can include a DAC 308 to generate the reconstructed voltage input signal. The DAC 308 can form the reconstructed voltage input signal from a digital input signal 312 provided by an ADC 310 digitizing an input signal to the stage 300. The stage 300 can include an inverter 314 to invert a digital output of the ADC 310 to form the digital input signal for the DAC 308, so that the voltage summation node 302 sees a negated and reconstructed voltage input signal from DAC 308. The inverter 314, in some cases, can flip a bit of the digital output of the ADC 310.

The voltage summation node 302 can form the voltage signal at the voltage summation node 302 through voltage-mode summation/subtraction of the delayed voltage input signal and the (negated and) reconstructed voltage input signal. Specifically, the voltage signal at the voltage summation node 302 is an average voltage of (1) the delayed voltage input signal and (2) a reconstructed voltage input signal. In other words, the average voltage is a sum of (1) the delayed voltage input signal and (2) a reconstructed voltage input signal divided by two. The reconstructed voltage input signal is generated from a digital input that has been inverted by inverter 314. Accordingly, the sum of (1) the delayed voltage input signal and (2) a reconstructed voltage input signal is equivalent to the subtraction of (1) the delayed voltage input signal by (2) a reconstructed voltage input signal.

Further to the transconductor 304, the stage 300 can further include a first filtering circuit network, e.g., RLC network 318, coupled to the voltage summation node 302. The RLC network 318 comprises filtering circuit components, including one or more of the following: resistor(s), inductor(s), and capacitor(s). The first filtering circuit can implement useful passive filtering functions. In some embodiments, the stage 300 can further include a second filtering circuit network, e.g., RLC & $g_m$ network 320, in a feedback configuration with respect to the tranconductor or in a feedback path of the transconductor 304. The second filtering circuit can implement useful active filters. The RLC & $g_m$ network 320 comprises filtering circuit components, including one or more of the following: resistor(s), inductor(s), capacitor(s), and transconductor(s).

Figure 4:
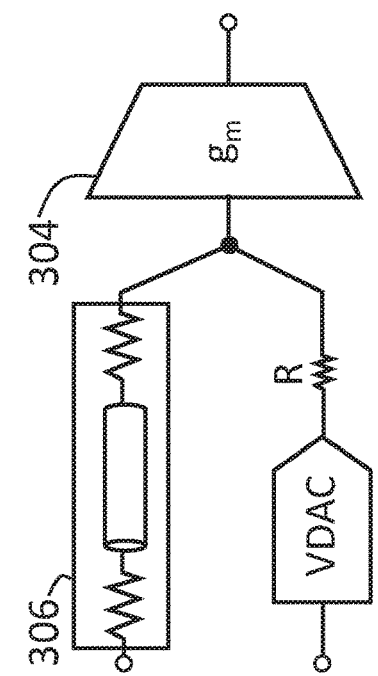
FIG. 4 illustrates one exemplary implementation of voltage-mode summation for a stage in a continuous-time multi-stage analog-to-digital converter, according to some embodiments of the disclosure.

In the example illustrated in FIG. 3, DAC 308 is a voltage-output DAC, and the stage 300 further comprises a resistor in series with an output of the DAC 308 (or one or more series-connected resistors at the output of the DAC). FIG. 4 illustrates one exemplary implementation of voltage-mode summation for a stage in a CT multi-stage ADC, according to some embodiments of the disclosure. The delaying element 306 and the voltage-output DAC ("VDAC") with one or more series-connected resistors ("R") are connected to the transconductor 304. A voltage-output DAC and one or more series-connected resistors can be implemented by a plurality of slices where the outputs of the slices are connected together at a common output node. The slices can be individually controlled by respective bits of the digital input word to the voltage-output DAC, connecting the slice to a first fixed voltage or to a second fixed voltage. The digital input word can then control the output voltage of the voltage-output DAC, such that the output voltage can represent the value of the digital input word. A slice can be implemented with a (complementary-metal-oxide semiconductor) inverter and a series-connected output resistor.

Figure 5:
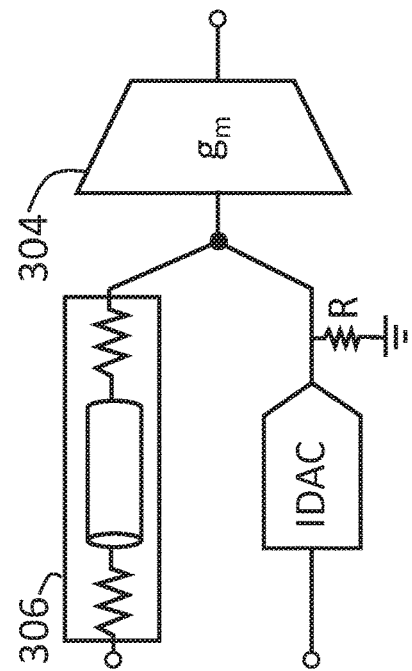
FIG. 5 illustrates another exemplary implementation of voltage-mode summation for a stage in a continuous-time multi-stage analog-to-digital converter, according to some embodiments of the disclosure.

Referring back to FIG. 3, in some embodiments, the DAC 308 is implemented with is a current-output DAC 316, and the stage 300 further comprises a resistor in parallel with an output of the DAC 316 (or one or more grounded resistors). FIG. 5 illustrates another exemplary implementation of voltage-mode summation for a stage in a CT multi-stage ADC, according to some embodiments of the disclosure. The delaying element 306 and the current-output DAC ("IDAC") with one or more grounded resistors ("R") are connected to the transconductor 304. In some cases, the one or more grounded resistors are referred to as termination resistors. As discussed previously, a current-output DAC can include current sources controlled by switches (i.e., transistor devices) steering currents towards the output of the current-output DAC based on the input digital word to the current-output DAC.

Exemplary Circuit Implementations for Voltage-Mode Summation

Figure 6:
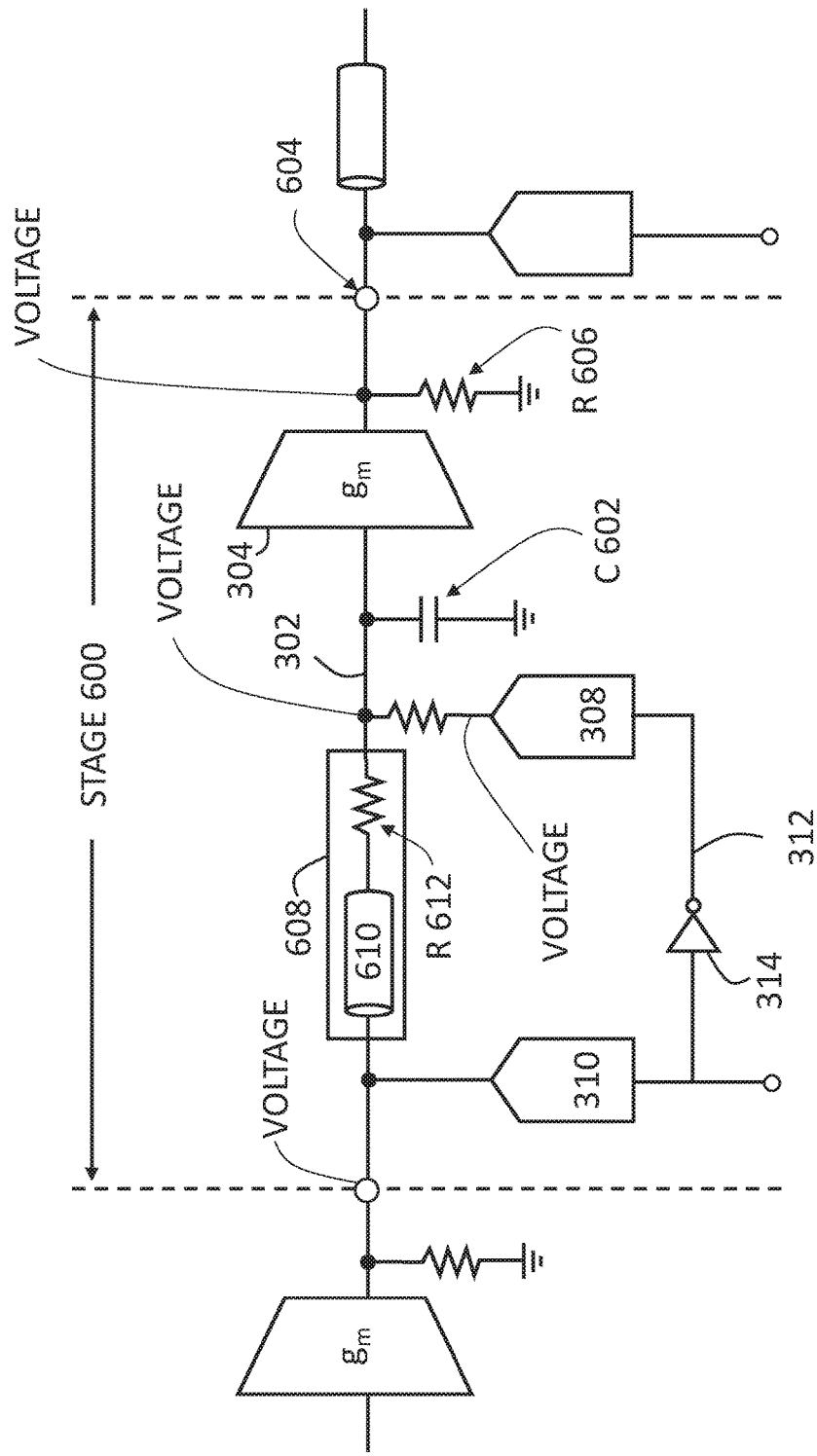
FIG. 6 illustrates an exemplary stage in a continuous-time multi-stage analog-to-digital converter with voltage-mode summation, according to some embodiments of the disclosure.
Figure 7:
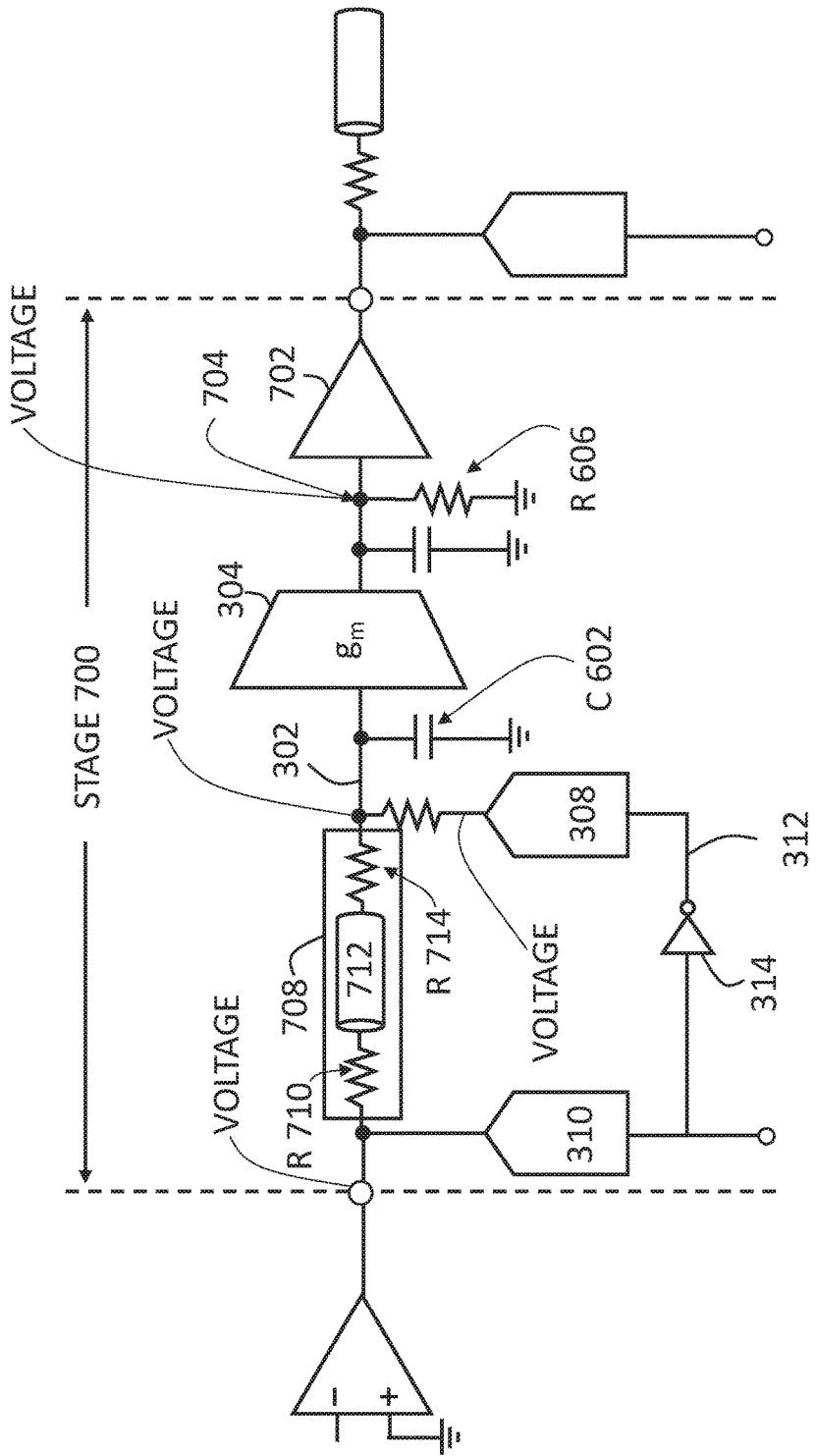
FIG. 7 illustrates another exemplary stage in a continuous-time multi-stage analog-to-digital converter with voltage-mode summation, according to some embodiments of the disclosure.
Figure 8:
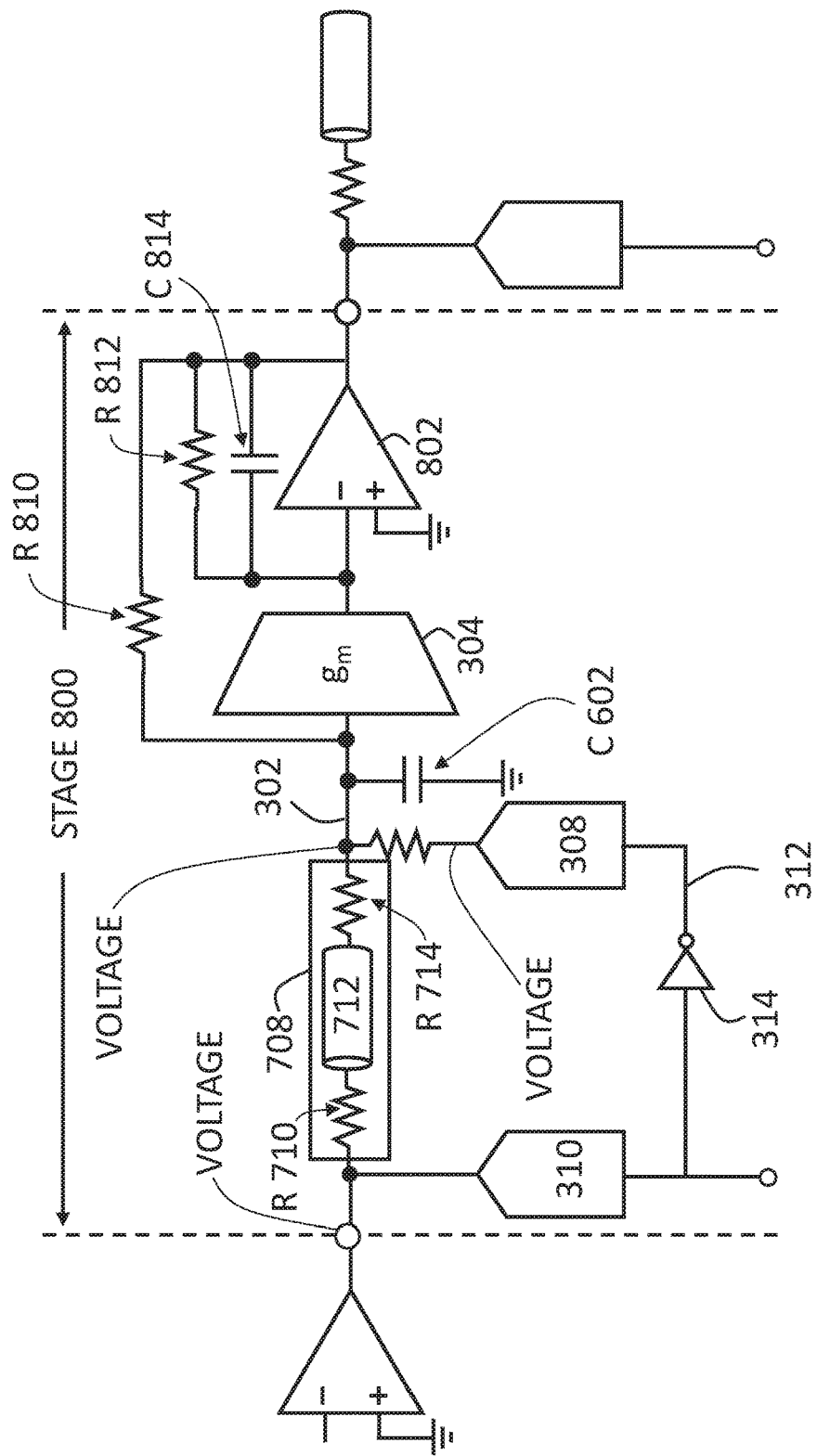
FIG. 8 illustrates yet another exemplary stage in a continuous-time multi-stage analog-to-digital converter with voltage-mode summation, according to some embodiments of the disclosure.

Voltage-mode summation as illustrated by FIG. 3 can be implemented in different ways to achieve different properties. For instance, the circuit implementation can be chosen to provide certain frequency responses of interstage gain, such as a first order low-pass response, a high-order high-pass response, and a bandpass response. FIGS. 6-8 shows some examples of circuit implementations of a stage in a CT multi-stage ADC, each FIGURE having a possibly different frequency response or characteristic behavior.

FIG. 6 illustrates an exemplary stage 600 in a CT multi-stage ADC with voltage-mode summation, according to some embodiments of the disclosure. In this exemplary circuit implementation, a filtering capacitor C 602 is connected to the voltage summation node 302 (i.e., input to transconductor 304). The filtering capacitor C 602 can ease DAC image filtering. The transconductor 304 senses the voltage signal at the voltage summation node 302 and translates it into a current. The current is converted back to a voltage at node 604 by the grounded resistor R 606. To have a proper delay line 610 or transfer function of the delay line 610, driving impedance and termination impedance has to match. Output impedance of transconductor 304 is infinite, and in this case, resistor R 606 can control the driving impedance. In terms of termination, the stage output impedance in this example absorbs the driving impedance. Accordingly, the delay line 608 is implemented with a delay line 610 and a resistor R 612. In some cases, resistor R 612 can be replaced by output resistor(s) at the output of the DAC 308 serving as termination resistor(s).

FIG. 7 illustrates another exemplary stage 700 in a CT multi-stage ADC with voltage-mode summation, according to some embodiments of the disclosure. Similar to FIG. 6, stage 700 has a filtering capacitor C 602, and the transconductor 304 senses the voltage signal at the voltage summation node 302 and translates it into a current. The current is converted back to a voltage at node 704 by the grounded resistor R 606. In this exemplary circuit implementation, a voltage buffer 702 is provided in series with the transconductor 304. The voltage buffer 702 can be used to buffer the output from the transconductor 304 or voltage at node 704 to drive the subsequent stage. In terms of termination, the voltage buffer 702 is considered a voltage source with zero impedance, and accordingly, the delay element 708 in this circuit example handles termination differently from FIG. 6. The delay element 708 includes a first resistor 710 (termination impedance), followed by a delay line 712, and followed by a second resistor 714. The first resistor 710 in front of the delay line can control the impedance.

FIG. 8 illustrates yet another exemplary stage 800 in a CT multi-stage ADC with voltage-mode summation, according to some embodiments of the disclosure. In this exemplary circuit implementation, a voltage buffer 702 seen in FIG. 7 is replaced by a more complex circuit structure. Similar to FIGS. 6 and 7, filtering capacitor C 602 can ease DAC image filtering. The stage 800 further includes an opamp 802 in series with the transconductor 304. A combination of the transconductor 304 and an opamp 802 form a high-order active filter (e.g., a hybrid bi-quad filter), which senses and filters the voltage signal at the voltage summation node 302. Specifically, a resistor R 810 (in the feedback path of the transconductor 304 and opamp 812) provides feedback from the output of opamp 802 to the input of the transconductor 304 and implements an additional summation path. Furthermore, resistor R 810 and capacitor C 814 (in the negative feedback paths of the opamp 812) provides feedback from the output of opamp 802 to the input of the opamp 802. The filtering function of the high-order active filter can advantageously improve the performance of the multi-stage ADC (e.g., providing higher-order image signal rejection). The termination for stage 800 is similar to the termination for stage 700 of FIG. 7.

Exemplary Circuit Implementations of the Delay Element

Figure 13:
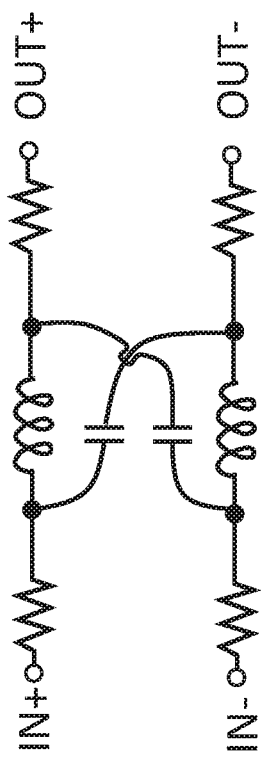
Figure 14:
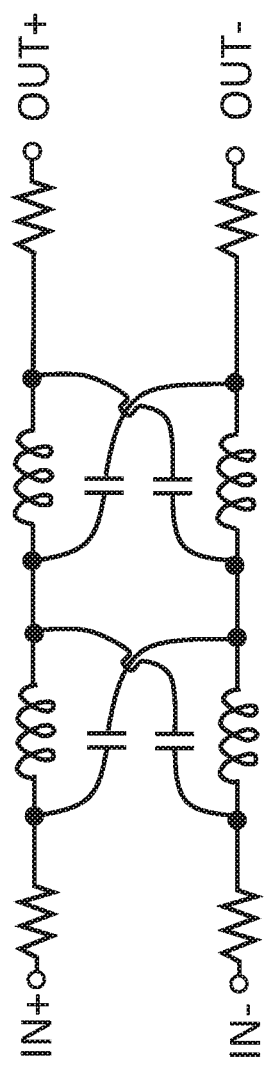

FIG. 9 shows a differential delay element, according to some embodiments of the disclosure. The FIG. illustrates how a delay element (seen in the FIGURES) can be provided in a differential circuit with the differential signal paths (i.e., the top path from IN+ to OUT+ and the bottom path from IN− to OUT−). The delay element can be implemented in different ways to provide different frequency responses, desired behaviors, and/or characteristic impedances. FIGS. 10-14 show different exemplary circuit implementations for the differential delay element of FIG. 9, according to some embodiments of the disclosure. FIGS. 10-12 shows examples where an RC (resistor-capacitor) lattice is used to provide a delay element. FIGS. 13 and 14 shows examples where one or more LC (inductor-capacitor) lattices is used to provide a delay element.

Time-Interleaving to Increase Speed

Figure 15:
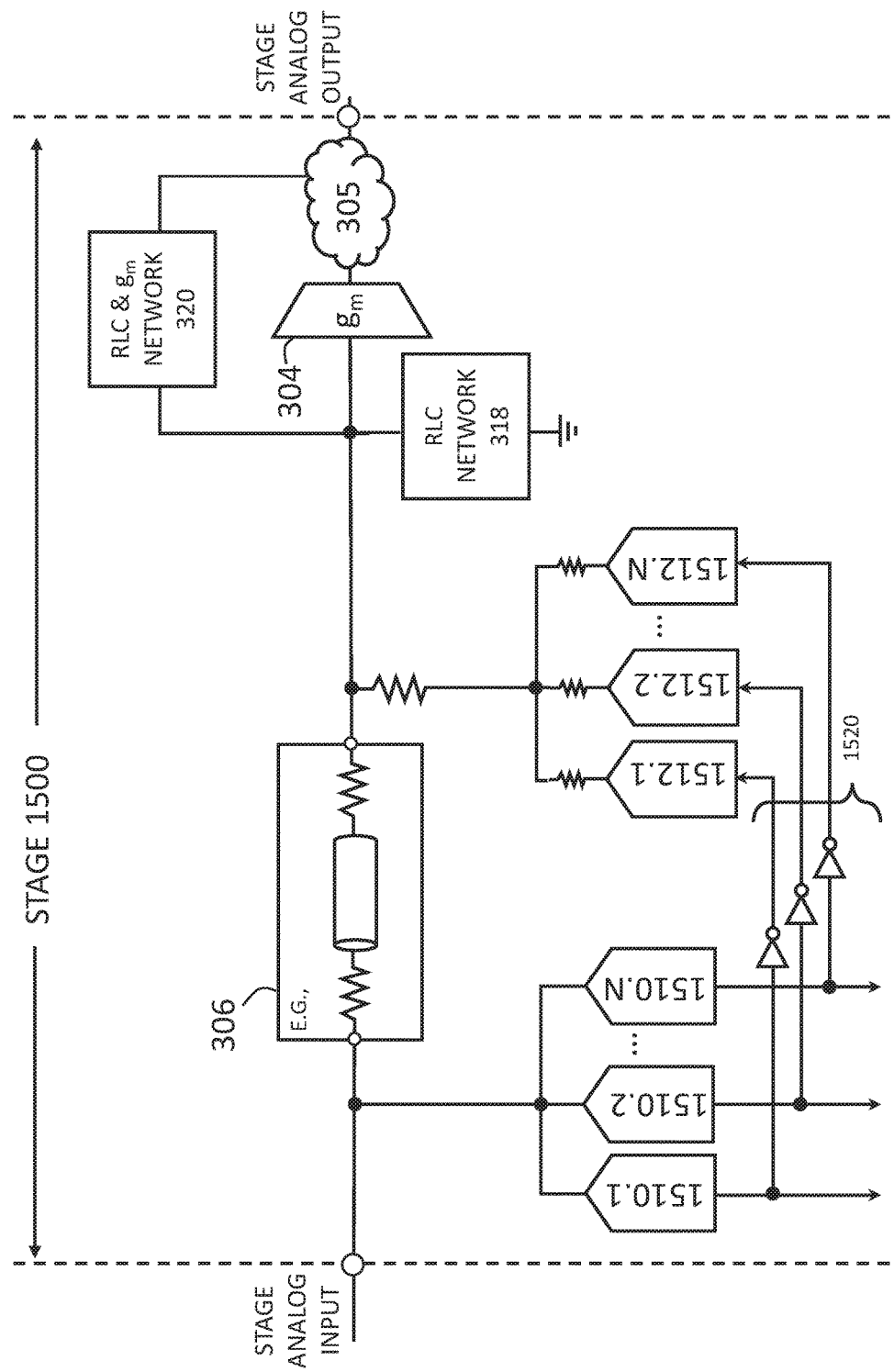
FIG. 15 illustrates an exemplary stage in a continuous-time multi-stage analog-to-digital converter with voltage-mode summation implementing time-interleaving, according to some embodiments of the disclosure.

FIG. 15 illustrates an exemplary stage 1500 in a CT multi-stage ADC with voltage-mode summation implementing time-interleaving, according to some embodiments of the disclosure. The bandwidth and speed of the stage can be improved through time-interleaving. For instance, stage 1500 can include a plurality of time-interleaved DACs, shown as DAC 1512.1, DAC 1512.2 .... DAC 1512.N, to generate the reconstructed voltage input signal from digital input signals 1520 provided by a plurality of time-interleaved ADCs, shown as ADC 1510.1, ADC 1510.2 .... ADC 1510.N, digitizing an analog input signal to the stage 1500. The time-interleaved ADCs can be driven by staggered or phase shifted clocks. The time-interleaved DACs can be driven by staggered or phase shifted clocks. The conversion can occur in a time-interleaved fashion, thereby increasing the bandwidth and speed of the stage 1500 (when compared to using just one ADC and one DAC).

In some embodiments, the stage 1500 can time-interleave the ADCs only, while a (single) high-speed DAC is used to generate the reconstructed voltage input. In other words, the stage 1500 has a (single) DAC to generate the reconstructed voltage input signal from digital input signals 1520 provided by a plurality of time-interleaved ADCs (e.g., ADC 1510.1, ADC 1510.2 ... ADC 1510.N) digitizing an input signal to the stage 1500.

Methods for Voltage-Mode Summation

Figure 16:
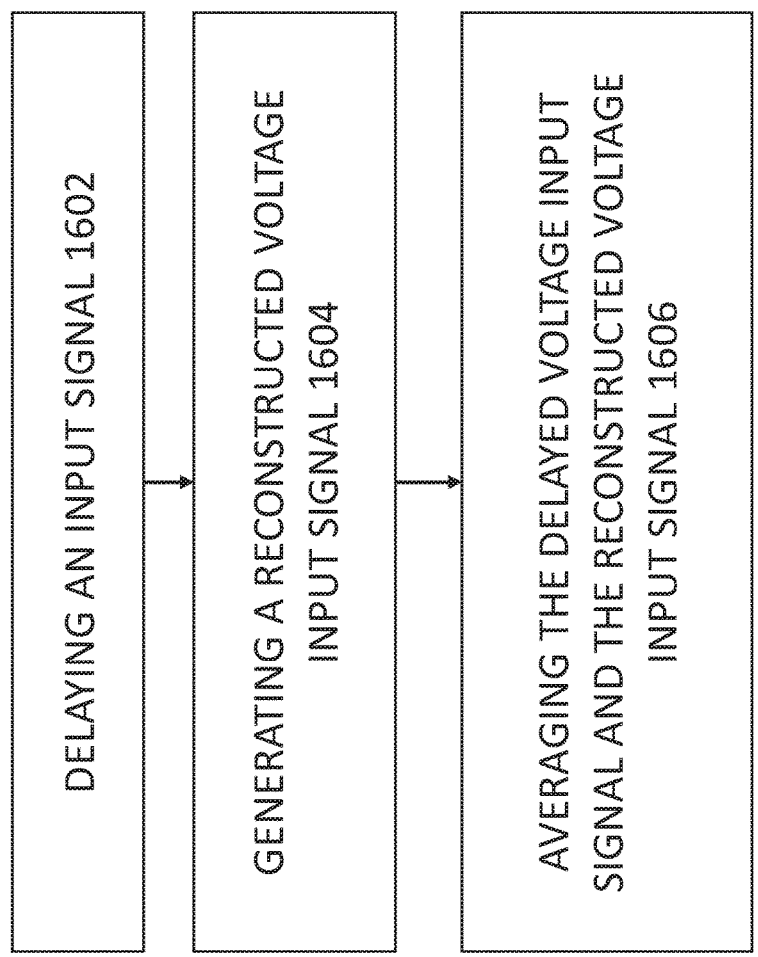
FIG. 16 is a flow diagram illustrating a method for voltage-mode summation in a stage of a continuous-time multi-stage analog-to-digital converter, according to some embodiments of the disclosure.

FIG. 16 is a flow diagram illustrating a method for voltage-mode summation in a stage of a CT multi-stage ADC, according to some embodiments of the disclosure. In 1602, an input signal to the stage is delayed to generate a delayed voltage input signal. In 1604, a reconstructed voltage input signal is generated from the input signal. In 1606, the delayed voltage input signal and the reconstructed voltage input signal are averaged to generate an averaged voltage signal.

In some embodiments, the method further includes converting the averaged voltage signal into a current output signal. The conversion can be performed by a transconductor.

In some embodiments, the method further includes filtering the averaged voltage signal by one or more filtering circuit networks. Filtering circuit networks can provide passive and/or active filtering to improve performance of the CT multi-stage ADC.

In some embodiments, generating the reconstructed voltage input signal includes digitizing the input signal to generate a digital input signal, and generating the reconstructed voltage input signal from the digital input signal. In other words, the reconstructed voltage input is generated by an ADC-DAC path. To implement subtraction through averaging, generating the reconstructed voltage input signal further includes inverting the digital input signal prior to generating the reconstructed voltage input signal.

EXAMPLES

Example 1 is a stage in a multi-stage analog-to-digital converter, comprising: a summation node to sum a delayed voltage input signal and a reconstructed voltage input signal; and a transconductor to sense a voltage signal at the summation node to generate an output signal of the stage.

In Example 2, the stage in Example 1 can further include a delaying element to generate the delayed voltage input signal from an input signal to the stage.

In Example 3, the stage in Example 1 or 2 can further include a digital-to-analog converter (DAC) to generate the reconstructed voltage input signal from a digital input signal provided by an analog-to-digital converter (ADC) digitizing an input signal to the stage.

In Example 4, the stage in Example 3 can further include the DAC being a voltage-output DAC, and the stage further comprising a resistor in series with an output of the DAC.

In Example 5, the stage in Example 3 can further include the DAC being a current-output DAC, and the stage further comprises a resistor in parallel with an output of the DAC.

In Example 6, the stage in Example 3, 4, or 5 can further include an inverter to invert a digital output of the ADC to form the digital input signal for the DAC.

In Example 7, the stage in any one of Examples 1-6 can further include a first filtering circuit network coupled to the summation node, wherein the first filtering circuit network comprises at least one of a resistor and capacitor.

In Example 8, the stage in any one of Examples 1-7 can further include a second filtering circuit network in a feedback configuration with respect to the transconductor.

In Example 9, the stage in any one of Examples 1-8 can further include a voltage buffer in series with the transconductor.

In Example 10, the stage in any one of Examples 1-9 can further include an operational amplifier in series with the transconductor.

In Example 11, the stage in any one of Examples 1-10 can further include a plurality of time-interleaved digital-to-analog converters (DACs) to generate the reconstructed voltage input signal from digital input signals provided by a plurality of time-interleaved analog-to-digital converters (ADCs) digitizing an input signal to the stage. Features in Example 4 or 5 can apply to the DAC in Example 11.

In Example 12, the stage in any one of Examples 1-11 can further include a digital-to-analog converter (DAC) to generate the reconstructed voltage input signal from digital input signals provided by a plurality of time-interleaved analog-to-digital converters (ADCs) digitizing an input signal to the stage. Features in Example 4 or 5 can apply to the DAC in Example 12.

In Example 13, the stage in any one of Examples 1-12 can further include the stage having one or more of the following (interstage gain) frequency responses: a first order low-pass response, a high-order high-pass response, and a bandpass response.

In Example 14, the stage in any one of Examples 1-13 can further include the multi-stage analog-to-digital converter being a continuous-time multi-stage analog-to-digital converter (e.g., CT MASH ADC, CT pipeline ADC, etc.).

Example 15 is a method for voltage-mode summation in a stage of a multi-stage analog-to-digital converter, the method comprising: delaying an input signal to the stage to generate a delayed voltage input signal; generating a reconstructed voltage input signal from the input signal; and averaging the delayed voltage input signal and the reconstructed voltage input signal to generate an averaged voltage signal.

In Example 16, the method of Example 15 can further include converting the averaged voltage signal into a current output signal.

In Example 17, the method of Example 15 or 16 can further include filtering the averaged voltage signal by one or more filtering circuit networks.

In Example 18, the method of any one of Examples 15-17 can further include generating the reconstructed voltage input signal comprising: digitizing the input signal to generate a digital input signal; and generating the reconstructed voltage input signal from the digital input signal.

In Example 19, the method of Example 18 can further include generating the reconstructed voltage input signal further comprising inverting the digital input signal prior to generating the reconstructed voltage input signal.

Example 20 is an apparatus for analog-to-digital conversion through voltage-mode summation, the apparatus comprising: means for delaying an input signal to generate a delayed voltage input signal; means for reconstructing the input signal to generate a reconstructed voltage input signal; means for averaging the delayed voltage input signal and a reconstructed voltage input signal to generate an averaged voltage signal; and transconductance means for sensing the averaged voltage signal.

Example 21 is an apparatus comprising means for implementing and/or carrying out the methods of any one of Examples 15-19 and/or any of the functionalities described herein.

Other Implementation Notes, Variations, and Applications

Using voltage-mode summation is distinct from current-mode summation for several reasons. For current-mode summation, the summation quality (or linearity of summation) depend on the summing node quality. For voltage-mode summation, the summation quality only depend on passive components, so the summation is fundamentally linear. It can be easier possible to design voltage-mode summation for wider bandwidth and higher speed applications. For current-mode summation, linearity of amplification is high since opamps are typically linear. For voltage-mode summation, linearity of amplification is moderate due to the use of the transconductor. For current-mode summation, active summation and active filtering may not be suitable for high-speed operation. For voltage-mode summation, passive summation and passive filtering may be particularly suitable for high-speed operation.

While the embodiments described herein are described in relation to voltage-mode summation in a CT MASH ADC, or a CT pipeline ADC, these types of CS ADCs are not meant to be limiting to the disclosure. Furthermore, the embodiments described herein can be applicable to a variety of converters, including other ADC architectures employing hybrid CT and DT circuit designs (which uses switched-capacitor circuits), etc. Voltage-mode summation circuits are applicable to MASH ADCs having different order modulators, or multi-stage ADCs having any number of suitable stages.

The present architecture for the voltage-mode summation are particularly suitable for high-speed, high precision applications where CT MASH ADCs or CT pipeline ADCs are used. Applications which can greatly benefit from the architecture include: instrumentation, testing, spectral analyzers, military purposes, radar, wired or wireless communications, mobile telephones (especially because standards continue to push for higher speed communications), and base stations.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, some of the functionalities described herein (e.g., calibration) may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on-chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. For instance, calibration can be implemented with an on-chip microprocessor (i.e., on-chip with the ADC) or by dedicated on-chip digital hardware. In various other embodiments, the digital filters or digital functionalities may be implemented in one or more silicon cores in Application Specific Integrated Circuits (ASICs), Field Programmable Gate Arrays (FPGAs), and other semiconductor chips.

All of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure, appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

The functions related to protecting the tunable resistors, such as the processes shown in FIG. 16, illustrate only some of the possible functions that may be executed by, or within, the circuits illustrated in the FIGURES or circuits coupled to the systems illustrated in the FIGURES (e.g., digital circuitry or an on-chip microprocessor). Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the disclosure, appended claims. Note that all optional features of the apparatus described above may also be implemented with respect to the method or process described herein and specifics in the examples may be used anywhere in one or more embodiments.

What is claimed is:

1. A stage in a multi-stage analog-to-digital converter, comprising:
 a voltage-output digital-to-analog converter (DAC) to generate a reconstructed voltage input signal from a digital input signal provided by an analog-to-digital converter (ADC) digitizing an input signal to the stage;
 a resistor in series with an output of the voltage-output DAC; and
 a summation node to sum a delayed voltage input signal and the reconstructed voltage input signal; and
 a transconductor to sense a voltage signal at the summation node to generate an output signal of the stage.

2. The stage in claim 1, further comprising:
 a delaying element to generate the delayed voltage input signal from an input signal to the stage.

3. The stage in claim 1, further comprising:
 an inverter to invert a digital output of the ADC to form the digital input signal for the DAC.

4. The stage in claim 1, further comprising:
 a first filtering circuit network coupled to the summation node, wherein the first filtering circuit network comprises at least one of a resistor and capacitor.

5. The stage in claim 1, further comprising:
 a second filtering circuit network in a feedback configuration with respect to the transconductor.

6. The stage in claim 1, further comprising:
 a voltage buffer in series with the transconductor.

7. The stage in claim 1, further comprising:
an operational amplifier in series with the transconductor.

8. The stage in claim 1, further comprising:
a plurality of time-interleaved digital-to-analog converters (DACs) to generate the reconstructed voltage input signal from digital input signals provided by a plurality of time-interleaved analog-to-digital converters (ADCs) digitizing an input signal to the stage.

9. The stage in claim 1, further comprising:
a digital-to-analog converter (DAC) to generate the reconstructed voltage input signal from digital input signals provided by a plurality of time-interleaved analog-to-digital converters (ADCs) digitizing an input signal to the stage.

10. The stage in claim 1, wherein the stage has one or more of the following frequency responses: a first order low-pass response, a high-order high-pass response, and a bandpass response.

11. The stage in claim 1, wherein the multi-stage analog-to-digital converter is a continuous-time multi-stage analog-to-digital converter.

12. A method for voltage-mode summation in a stage of a multi-stage analog-to-digital converter, the method comprising:
delaying an input signal to the stage to generate a delayed voltage input signal;
generating a reconstructed voltage input signal from the input signal; and
averaging the delayed voltage input signal and the reconstructed voltage input signal to generate an averaged voltage signal.

13. The method of claim 12, further comprising:
converting the averaged voltage signal into a current output signal.

14. The method of claim 12, further comprising:
filtering the averaged voltage signal by one or more filtering circuit networks.

15. The method of claim 12, wherein generating the reconstructed voltage input signal comprises:
digitizing the input signal to generate a digital input signal; and
generating the reconstructed voltage input signal from the digital input signal.

16. The method of claim 15, wherein generating the reconstructed voltage input signal further comprises:
inverting the digital input signal prior to generating the reconstructed voltage input signal.

17. An apparatus for analog-to-digital conversion through voltage-mode summation, the apparatus comprising:
means for delaying an input signal to generate a delayed voltage input signal;
means for reconstructing the input signal to generate a reconstructed voltage input signal;
means for averaging the delayed voltage input signal and a reconstructed voltage input signal to generate an averaged voltage signal; and
transconductance means for sensing the averaged voltage signal.

18. A stage in a multi-stage analog-to-digital converter, comprising:
a current-output digital-to-analog converter (DAC) to generate a reconstructed voltage input signal from a digital input signal provided by an analog-to-digital converter (ADC) digitizing an input signal to the stage;
a resistor in parallel with an output of the current-output DAC; and
a summation node to sum a delayed voltage input signal and the reconstructed voltage input signal; and
a transconductor to sense a voltage signal at the summation node to generate an output signal of the stage;
wherein the DAC is a current-output DAC, and the stage further comprises a resistor in parallel with an output of the DAC.

19. The stage in claim 18, further comprising:
a filtering capacitor connected to the summation node.

20. The stage in claim 18, further comprising:
an operational amplifier in series with the transconductor, wherein the transconductor and the operational amplifier form a part of an active filter.

21. The stage in claim 20, further comprising:
a further resistor in a feedback path of the transconductor and the operational amplifier.

22. The stage in claim 20, further comprising:
a further resistor and a capacitor in parallel negative feedback paths of the operational amplifier.

23. The stage in claim 1, further comprising:
a grounded resistor at an output of the transconductor to convert a current back to a voltage.

24. The stage in claim 2, wherein the delaying element comprises a delay line and a resistor.

25. The stage in claim 2, wherein the delaying element comprises a first resistor, a delay line following the first resistor, and a second resistor following the delay line.

* * * * *